US005958648A

United States Patent [19]

Nishimura et al.

[11] Patent Number: 5,958,648

[45] Date of Patent: Sep. 28, 1999

[54] RADIATION SENSITIVE RESIN COMPOSITION

[75] Inventors: Isao Nishimura; Masayuki Endo, both of Mie, Japan

[73] Assignee: JSR Corporation, Tokyo, Japan

[21] Appl. No.: 09/082,192

[22] Filed: May 21, 1998

[30] Foreign Application Priority Data

May 22, 1997 [JP] Japan .................................... 9-131948

[51] Int. Cl.[6] .................................................... G03C 1/492

[52] U.S. Cl. .................................... 430/270.1; 430/285.1; 430/286.1; 430/914; 430/921; 430/920; 430/927

[58] Field of Search ............................. 430/270.1, 285.1, 430/286.1, 908, 914, 921, 920, 927; 522/156

[56] References Cited

U.S. PATENT DOCUMENTS

| | | | |
|---|---|---|---|
| 4,963,471 | 10/1990 | Trout et al. | 430/282 |
| 5,362,597 | 11/1994 | Sano et al. | 430/191 |
| 5,364,910 | 11/1994 | Takinishi et al. | 525/327.3 |
| 5,399,604 | 3/1995 | Sano et al. | 524/356 |
| 5,432,039 | 7/1995 | Shimokawa et al. | 430/191 |

FOREIGN PATENT DOCUMENTS

| | | |
|---|---|---|
| 42 07 264 | 9/1993 | Germany . |

*Primary Examiner*—John A. McPherson
*Assistant Examiner*—Rosemary Ashton
*Attorney, Agent, or Firm*—Oblon, Spivak, McClelland, Maier & Neustadt, P.C.

[57] ABSTRACT

A radiation sensitive resin composition comprising (A) a fluorine-containing copolymer of hexafluoropropylene, at least one compound selected from the group consisting of unsaturated carboxylic acids and unsaturated carboxylic anhydrides, and an unsaturated compound (B) an acid generating compound which generates an acid upon exposure to radiation; (C) a cross-linkable compound; and (D) an organic solvent. The composition suitable is useful for a negative resist for forming a mask for the production of a circuit such as a semiconductor integrated circuit or a thin film transistor circuit for liquid crystal displays as well as a material for forming a permanent film such as an interlaminar insulating film or a color filter protective film.

14 Claims, No Drawings

RADIATION SENSITIVE RESIN COMPOSITION

DETAILED DESCRIPTION OF THE INVENTION

This invention relates to a radiation sensitive resin composition. More specifically, it relates to a radiation sensitive resin composition suitable for use as a negative resist for forming a mask for the production of a circuit such as a semiconductor integrated circuit or a thin film transistor (to be abbreviated as TFT hereinafter) circuit for liquid crystal displays (to be abbreviated as LCD hereinafter) as well as a material for forming a permanent film such as an interlaminar insulating film or a color filter protective film.

A radiation sensitive resin composition for use as a resist having high resolution and high sensitivity has recently been required for the production of semiconductor integrated circuits (to be abbreviated as ICs hereinafter).

In the production of ICs, a resist which can provide high resolution in submicron order or less may be required. However, there is strongly desired a high-sensitivity resist which can provide resolution in the order of several micrometers to several tens of micrometers and shows high yields even when throughput is increased by using especially a silicon wafer having a large diameter.

In the step of etching a silicon wafer for the production of ICs, a wet etching system which enables a large-quantity batch treatment is employed in most cases, and a formed resist pattern must have adhesion to a substrate and so high resistance to chemicals that it is not corroded by an etching solution. When an ion implantation step is added, the resist pattern must have so high resistance to heat that it can withstand heating at a high temperature.

As a negative resist, there has been developed a chemically amplified negative resist which comprises polyhydroxystyrene or a novolak resin as a base, an acid generating compound which generates an acid upon exposure to radiation and a cross-linking agent such as methylolmelamine or alkoxymelamine.

However, this chemically amplified negative resist is said to involve such a problem that the size of the obtained pattern is greatly changed when the time from the step of exposure to radiation till a heat treatment (may be referred to as "PEB treatment" hereinafter) or by changing the heating temperature of the PEB treatment.

Further, as the chemically amplified negative resist changes its color by heating, it cannot be used as a protective film for liquid crystal color filters or an optical material for microlenses and the like.

Of LCDs which have made rapid progress in recent years, an active matrix LCD incorporating a TFT for each pixel (to be abbreviated as AM-LCD hereinafter) is considered as the most prospective next-generation display device substituting a cathode ray tube, owing to its fast response speed, and an increase in the area of a display screen is desired.

To form the TFT circuit of such AM-LCD, a resist is used as in the case of ICs.

To produce an LCD, an attempt is being made to form from the same composition as that of a resist a permanent film such as an interlaminar insulating film or a color filter protective film which has been formed from a thermosetting resin composition in the prior art.

Such permanent film for LCDs is required to have high resolution, heat resistance, chemical resistance, transparency and insulating properties. A permanent film which is fully satisfactory in terms of chemical resistance, adhesion to a substrate, heat resistance, transparency and insulating properties, however, cannot be formed from the above negative resist of the prior art.

It is an object of the present invention to provide a novel radiation sensitive resin composition which can be developed with an alkaline aqueous solution, has high sensitivity and makes it possible to form with ease a patterned thin film having excellent characteristic properties such as insulating properties, flatness, heat resistance, solvent resistance and transparency as well as excellent low dielectric properties which have been difficult to obtain together with the above characteristic properties in the prior art.

It is another object of the present invention to provide a radiation sensitive resin composition for the production of a circuit such as a TFT circuit for ICs and LCDs or the formation of a permanent film such as an interlaminar insulating film for LCDs, color filter protective film or circuit protective film, which can provide a permanent film having excellent heat resistance, adhesion to a substrate, transparency at a visible range, chemical resistance and insulating properties.

Other objects and advantages of the present invention will become apparent from the following description.

According to the present invention, the above objects and advantages of the present invention can be attained by a radiation sensitive resin composition comprising:

(A) fluorine-containing copolymer of (a-1) hexafluoropropylene, (a-2) at least one compound selected from the group consisting of unsaturated carboxylic acids and unsaturated carboxylic anhydrides, and (a-3) an unsaturated compound copolymerizable with the components (a-1) and (a-2);

(B) an acid generating compound which generates an acid upon exposure to radiation;

(C) a cross-linkable compound; and (D) an organic solvent in which the components (A), (B) and (C) are dissolved.

The radiation sensitive resin composition of the present invention will be described in detail hereinafter.

Component (A)

A polymer used as the component (A) is a fluorine-containing copolymer of (a-1) hexafluoropropylene, (a-2) at least one compound selected from the group consisting of unsaturated carboxylic acids and unsaturated carboxylic anhydrides, and (a-3) an unsaturated compound copolymerizable with the components (a-1) and (a-2).

The unsaturated carboxylic acids and unsaturated carboxylic anhydrides as the component (a-2) constituting the polymer include unsaturated mono- and di-carboxylic acids, (meth)acrylates of hydroxy-fatty acids, (meth)acrylates of aromatic hydroxycarboxylic acids, mono(meth) acryloyloxyethyl esters of dicarboxylic acids, monoalkyl esters of unsaturated polycarboxylic acids and unsaturated dicarboxylic anhydrides.

Of these, preferred are the unsaturated mono- and di-carboxylic acids having 3 to 20 carbon atoms, the (meth) acrylates of hydroxy-fatty acids having 2 to 20 carbon atoms, the (meth)acrylates of aromatic hydroxycarboxylic acids such as (meth)acryloyloxybenzene mono- and di-carboxylic acids, the mono(meth)acryloyloxyethyl esters of dicarboxylic acids having 3 to 20 carbon atoms, the monoalkyl esters of unsaturated polycarboxylic acids in which the unsaturated polycarboxylic acid has 6 to 20 carbon atoms and an alkyl group has 1 to 20 carbon atoms, and the unsaturated dicarboxylic anhydrides such as aliphatic dicarboxylic acids having 3 to 20 carbon atoms, alicyclic dicarboxylic acids having 5 to 30 carbon atoms and vinylphthalic anhydride.

Illustrative examples of the component (a-2) include unsaturated mono- and di-carboxylic acids such as crotonic acid, maleic acid, 3-butenoic acid, 4-pentenoic acid and itaconic acid; (meth)acrylates of hydroxy-fatty acids such as (meth)acryloyloxyacetic acid, 3-(meth)acryloyloxypropionic acid, 2-(meth)acryloyloxypropionic acid and 4-(meth)acryloyloxybutanoic acid; (meth)acrylates of aromatic hydroxycarboxylic acids such as 4-(meth)acryloyloxybenzoic acid, 3-(meth)acryloyloxybenzoic acid, 2-(meth)acryloyloxybenzoic acid, 4-(meth)acryloyloxyphthalic acid, 3-(meth)acryloyloxyphthalic acid, 4-(meth)acryloyloxyisophthalic acid, 5-(meth)acryloyloxyisophthalic acid and 2-(meth)acryloyloxyterephthalic acid; mono(meth)acryloyloxyethyl esters of dicarboxylic acids such as mono(2-(meth)acryloyloxy)ethyl succinate, mono(2-(meth)acryloyloxy)ethyl phthalate, mono(2-(meth)acryloyloxy)ethyl isophthalate, mono(2-(meth)acryloyloxy)ethyl terephthalate, mono(2-(meth)acryloyloxy)ethyl tetrahydrophthalate, mono(2-(meth)acryloyloxy)ethyl tetrahydroisophthalate and mono(2-(meth)acryloyloxy)ethyl tetrahydroterephthalate; monoalkyl esters having a carboxyl group of unsaturated carboxylic acids such as monomethyl, monoethyl, monopropyl, mono-i-propyl, monobutyl, mono-sec-butyl and mono-tert butyl of itaconic acid; unsaturated carboxylic anhydrides such as maleic anhydride, itaconic anhydride, citraconic anhydride, muconic anhydride, 3-vinylphthalic anhydride, 4-vinylphthalic anhydride, methyl-5-norbornene-2,3-dicarboxylic anhydride, 5-norbornene-2,3-dicarboxylic anhydride, 3,4,5,6-tetrahydrophthalic anhydride, cis-1,2,3,6-tetrahydrophthalic anhydride and dimethyltetrahydrophthalic anhydride; and the like. These carboxyl group-containing monomers may be used alone or in combination of two or more.

Illustrative examples of the unsaturated compound, as the component (a-3), copolymerizable with the above components (a-1) and (a-2) include hydroxyl group-containing vinyl ethers, hydroxyl group-containing allyl ethers, allyl alcohol, alkyl vinyl ethers, cycloalkyl vinyl ethers, perfluoro(alkyl vinyl ethers), perfluoro(alkoxyalkyl vinyl ethers), (fluoroalkyl)vinyl ethers, (fluoroalkoxyalkyl)vinyl ethers, fluoroolefins, vinyl carboxylates, α-olefins, fluorine-containing (meth)acrylates, (meth)acrylates, epoxy group-containing (meth)acrylates, epoxy group-containing unsaturated aliphatic compounds and glycidyl ethers.

Of these, preferred are the hydroxyl group-containing vinyl ethers having 3 to 20 carbon atoms, the hydroxyl group-containing allyl ethers having 4 to 20 carbon atoms, the alkyl vinyl ethers in which the alkyl group has 1 to 20 carbon atoms, the cycloalkyl vinyl ethers in which the cycloalkyl group has 3 to 30 carbon atoms, the perfluoro(alkyl vinyl ethers) in which the alkyl group has 1 to 20 carbon atoms, the perfluoro(alkoxyalkyl vinyl ethers) in which the an alkoxyalkyl group has 2 to 20 carbon atoms, the (fluoroalkyl)vinyl ethers in which the fluoroalkyl group has 1 to 20 carbon atoms, the (fluoroalkoxyalkyl)vinyl ethers in which the fluoroalkoxyalkyl group has 2 to 20 carbon atoms, the fluoroolefins having 2 to 20 carbon atoms, the vinyl carboxylates in which the carboxylic acid is monocarboxylic acids having 1 to 20 carbon atoms, the α-olefins having 2 to 20 carbon atoms, the fluorine-containing (meth)acrylates such as fluoroalkyl esters of (meth)acrylic acids having 1 to 20 carbon atoms, the (meth)acrylates such as alkyl esters of (meth)acrylic acids having 3 to 20 carbon atoms, the epoxy-containing (meth)acrylates such as epoxy alkyl esters of (meth)acrylic acids having 5 to 20 carbon atoms, the epoxy group-containing unsaturated aliphatic compounds having 4 to 20 carbon atoms, and the glycidyl ethers such as mono-, di- and tri-glycidyloxy ethers in which a residual unsaturated group, excluding a glycidyloxy group, has 2 to 20 carbon atoms.

Illustrative examples of the component (a-3) include hydroxyl group-containing vinyl ethers such as 2-hydroxyethyl vinyl ether, 3-hydroxypropyl vinyl ether, 2-hydroxypropyl vinyl ether, 4-hydroxybutyl vinyl ether, 3-hydroxybutyl vinyl ether, 5-hydroxypentyl vinyl ether and 6-hydroxyhexyl vinyl ether; hydroxyl group-containing allyl ethers such as 2-hydroxyethyl allyl ether, 4-hydroxybutyl allyl ether and glycerol monoallyl ether; alkyl vinyl ethers and cycloalkyl vinyl ethers such as methyl vinyl ether, ethyl vinyl ether, n-propyl vinyl ether, isopropyl vinyl ether, n-butyl vinyl ether, isobutyl vinyl ether, tert-butyl vinyl ether, n-pentyl vinyl ether, n-hexyl vinyl ether, n-octyl vinyl ether, n-dodecyl vinyl ether, 2-ethylhexyl vinyl ether and cyclohexyl vinyl ether; perfluoro(alkyl vinyl ethers) and perfluoro(alkoxyalkyl vinyl ethers) such as perfluoro(methyl vinyl ether), perfluoro(ethyl vinyl ether), perfluoro(propyl vinyl ether), perfluoro(butyl vinyl ether), perfluoro(isobutyl vinyl ether) and perfluoro(propoxypropyl vinyl ether); (fluoroalkyl)vinyl ethers and (fluoroalkoxyalkyl)vinyl ethers represented by the formula $CH_2{=}CH{-}O{-}Rf$ (Rf is an alkyl group containing a fluorine atom or alkoxyalkyl group); fluoroolefins such as vinylidene fluoride, chlorotrifluoroethylene, 3,3,3-trifluoropropylene and tetrafluoroethylene; vinyl carboxylates such as vinyl acetate, vinyl propionate, vinyl butyrate, vinyl pivalate, vinyl caproate, vinyl tert-decanoate and vinyl stearate; α-olefins such as ethylene, propylene and isobutene; fluorine-containing (meth)acrylates such as 2,2,2-trifluoroethyl (meth)acrylate, 2,2,3,3,3-pentafluoropropyl (meth)acrylate, 2-(perfluorobutyl)ethyl (meth)acrylate, 2-(perfluorohexyl)ethyl (meth)acrylate, 2-(perfluorooctyl)ethyl (meth)acrylate and 2-(perfluorodecyl)ethyl (meth)acrylate; (meth)acrylates such as methyl (meth)acrylate, ethyl (meth)acrylate, n-butyl (meth)acrylate, isobutyl (meth)acrylate, 2-methoxyethyl (meth)acrylate, 2-ethoxyethyl (meth)acrylate and 2-(n-propoxy)ethyl (meth)acrylate; epoxy group-containing (meth)acrylates such as glycidyl (meth)acrylate, α-ethylglycidyl (meth)acrylate, α-n-propylglycidyl (meth)acrylate, a-n-butylglycidyl (meth)acrylate, 3,4-epoxybutyl (meth)acrylate, 3,4-epoxyheptyl (meth)acrylate and α-ethyl-6,7-epoxyheptyl (meth)acrylate; epoxy group-containing unsaturated aliphatic compounds such as allyl glycidyl ether, 2-vinylcyclohexene oxide, 3-vinylcyclohexene oxide and 4-vinylcyclohexene oxide; glycidyl ethers such as vinyl glycidyl ether, 2-vinylbenzyl glycidyl ether, 3-vinylbenzyl glycidyl ether, 4-vinylbenzyl glycidyl ether, α-methyl-2-vinylbenzyl glycidyl ether, α-methyl-3-vinylbenzyl glycidyl ether, α-methyl-4-vinylbenzyl glycidyl ether, 2,3-diglycidyloxymethyl styrene, 2,4-diglycidyloxymethyl styrene, 2,5-diglycidyloxymethyl styrene, 2,6-diglycidyloxymethyl styrene, 2,3,4-triglycidyloxymethyl styrene, 2,3,5-triglycidyloxymethyl styrene, 2,3,6-triglycidyloxymethyl styrene, 3,4,5-triglycidyloxymethyl styrene and 2,4,6-triglycidyloxymethyl styrene; and the like.

These monomers may be used alone or in combination of two or more.

Of the above copolymerizable monomers, monomers containing no fluorine atom such as alkyl vinyl ethers, cycloalkyl vinyl ethers and vinyl carboxylates are preferably used to increase the yield of the fluorine-containing copolymer in the present invention. Low molecular weight monomers such as methyl vinyl ether, ethyl vinyl ether, n-propyl vinyl ether, isopropyl vinyl ether, vinyl acetate, vinyl propionate, vinyl butyrate and vinyl pivalate are particularly preferably used to increase the content of fluorine in the fluorine-containing copolymer. Use in combination of hexafluoropropylene and perfluoroalkyl perfluorovinyl ether or perfluoroalkoxyalkyl perfluorovinyl ether is also preferred. Use of a branched monomer such as isopropyl vinyl ether, tert-butyl vinyl ether or vinyl pivalate is effective in increasing the hardness of the fluorine-containing copolymer.

As for the ratio of monomers constituting the fluorine-containing copolymer in the present invention, hexafluoropropylene is preferably contained in an amount of 20 to 70 wt %, more preferably 25 to 55 wt %; the compound selected from the group consisting of unsaturated carboxylic acids and unsaturated carboxylic anhydrides is preferably contained in an amount of 1 to 40 wt %, more preferably 10 to 30 wt %; and the other copolymerizable monomer is preferably contained in an amount of 10 to 70 wt %. When the proportion of hexafluoropropylene is less than 53 wt %, it is preferred to copolymerize a fluorine-containing monomer other than hexafluoropropylene, such as perfluoro(alkyl vinyl ether) or perfluoro(alkoxyalkyl vinyl ether) in order to increase the content of fluorine. The total fluorine content of the fluorine-containing copolymer is preferably 40 wt % or more, more preferably 45 wt % or more. When the proportion of the structural unit of the compound selected from the group consisting of unsaturated carboxylic acids and unsaturated carboxylic anhydrides is less than 1 wt %, the alkali solubility of the polymer lowers, sufficiently high crosslinking density is hardly obtained, and sensitivity and the ratio of residual film thickness may lower.

The fluorine-containing polymer is produced by radical polymerizing the specific monomers (a-1), (a-2) and (a-3), or specific monomers and a copolymerizable monomer in a polymerization solvent. As required, these are polymerized while the functional groups of the specific monomers and the copolymerizable monomer are protected, and then unprotected.

Illustrative examples of the polymerization solvent used for the production of the fluorine-containing copolymer include alcohols such as methyl alcohol, ethyl alcohol, propyl alcohol and butyl alcohol; cyclic ethers such as tetrahydrofuran and dioxane; aromatic hydrocarbons such as benzene, toluene and xylene; amide-based aprotic polar solvents such as N,N-dimethylformamide and N-methyl-2-pyrrolidone; esters such as ethyl acetate, butyl acetate, isoamyl acetate and ethyl lactate; alkoxy esters such as methyl 3-methoxypropionate, methyl 2-methoxypropionate, ethyl 3-methoxypropionate, ethyl 2-methoxypropionate, ethyl 3-ethoxypropionate and ethyl 2-ethoxypropionate; (di) glycol dialkyl esters such as ethylene glycol dimethyl ether, diethylene glycol dimethyl ether, diethylene glycol diethyl ether, diethylene glycol methyl ethyl ether, propylene glycol dimethyl ether and dipropylene glycol dimethyl ether; (di) glycol monoalkyl ethers such as ethylene glycol monomethyl ether, ethylene glycol monoethyl ether, diethylene glycol monomethyl ether, diethylene glycol monoethyl ether, propylene glycol monomethyl ether, propylene glycol monoethyl ether, dipropylene glycol monomethyl ether and dipropylene glycol monoethyl ether; glycol monoalkyl ether esters such as propylene glycol monomethyl ether acetate, carbitol acetate and ethyl cellosolve acetate; and ketones such as cyclohexanone, methyl ethyl ketone, methyl isobutyl ketone and 2-heptanone. These polymerization solvents may be used alone or in combination of two or more.

The ratio of the polymerization solvent to the starting reaction materials is not particularly limited. Generally speaking, the polymerization solvent is used in an amount of 20 to 1,000 parts by weight, based on 100 parts by weight of the reaction materials.

A polymerization initiator for radical polymerization is an azo compound such as 2,2'-azobisisobutyronitrile, 2,2'-azobis-(2,4-dimethylvaleronitrile) or 2,2'-azobis(4-methoxy-2,4-dimethylvaleronitrile), or an organic peroxide such as benzoyl peroxide, lauroyl peroxide, tert-butylperoxy pivalate or 1,1-bis(tert-butylperoxy)cyclohexane, or hydrogen peroxide. When a peroxide is used as the polymerization initiator, it may be combined with a reducing agent as a redox polymerization initiator.

The fluorine-containing copolymer has an average molecular weight, in terms of polystyrene, of 1,000 to 200,000, preferably 2,000 to 70,000. When a fluorine-containing copolymer having an average molecular weight, in terms of polystyrene, of less than 1,000 is used, the obtained pattern may have a poor shape, the ratio of residual film thickness of the pattern may lower, or the heat resistance of the pattern may deteriorate. On the other hand, when a fluorine-containing copolymer having an average molecular weight, in terms of polystyrene, of more than 200,000 is used, the coating properties of the resulting radiation sensitive resin composition may be unsatisfactory, developability may lower, or the obtained pattern may have a poor shape.

Component (B)

The acid generating compound, which generates an acid upon exposure to radiation, as the component (B) is selected from the group consisting of trichloromethyl-s-triazines, diaryl iodonium salts, triaryl sulfonium salts, quaternary ammonium salts and sulfonic acid esters.

The trichloromethyl-s-triazines include, for example, tris (2,4,6-trichloromethyl)-s-triazine, 2-phenyl-bis(4,6-trichloromethyl)-s-triazine, 2-(4-chlorophenyl)-bis(4,6-trichloromethyl)-s-triazine, 2-(3-chlorophenyl)-bis(4,6-trichloromethyl)-s-triazine, 2-(2-chlorophenyl)-bis(4,6-trichloromethyl)-s-triazine, 2-(4-methoxyphenyl)-bis(4,6-trichloromethyl)-s-triazine, 2-(3-methoxyphenyl)-bis(4,6-trichloromethyl)-s-triazine, 2-(2-methoxyphenyl)-bis(4,6-trichloromethyl)-s-triazine, 2-(4-methylthiophenyl)-bis(4,6-trichloromethyl)-s-triazine, 2-(3-methylthiophenyl)-bis(4,6-trichloromethyl)-s-triazine, 2-(2-methylthiophenyl)-bis(4,6-trichloromethyl)-s-triazine, 2-(4-methoxynaphthyl)-bis(4,6-trichloromethyl)-s-triazine, 2-(3-methoxynaphthyl)-bis(4,6-trichloromethyl)-s-triazine, 2-(2-methoxynaphthyl)-bis(4,6-trichloromethyl)-s-triazine, 2-(4-methoxy-β-styryl)-bis(4,6-trichloromethyl)-s-triazine, 2-(3-methoxy-β-styryl)-bis(4,6-trichloromethyl)-s-triazine, 2-(2-methoxy-β-styryl)-bis(4,6-trichloromethyl)-s-triazine, 2-(3,4,5-trimethoxy-β-styryl)-bis(4,6-trichloromethyl)-s-triazine, 2-(4-methylthio-β-styryl)-bis(4,6-trichloromethyl)-s-triazine, 2-(3-methylthio-β-styryl)-bis(4,6-trichloromethyl)-s-triazine, 2-(3-methylthio-β-styryl)-bis( 4,6-trichloromethyl)-s-triazine, 2-piperonyl-bis(4,6-trichloromethyl)-s-triazine, 2-[2-(furan-2-yl)ethenyl]-bis(4,6-trichloromethyl)-s-triazine, 2-[2-(5-methylfuran-2-yl)ethenyl]-bis(4,6-trichloromethyl)-s-triazine, 2-[2-(4-diethylamino-2-methylphenyl)ethenyl]-bis (4,6-trichloromethyl)-s-triazine, and the like.

The diaryl iodonium salts include, for example, diphenyl iodonium tetrafluoroborate, diphenyl iodonium hexafluorophosphonate, diphenyl iodonium hexafluoroarsenate, diphenyl iodonium trifluoromethane sulfonate, diphenyl iodonium trifluoroacetate, diphenyl iodonium-p-toluene sulfonate, diphenyl iodonium butyltris (2,6-difluorophenyl)borate, diphenyl iodonium hexyltris(p-chlorophenyl)borate, diphenyl iodonium hexyltris(3-trifluoromethylphenyl)borate, 4-methoxyphenylphenyl iodonium tetrafluoroborate, 4-methoxyphenylphenyl iodonium hexafluorophosphonate, 4-methoxyphenylphenyl iodonium hexafluoroarsenate, 4-methoxyphenylphenyl iodonium trifluoromethane sulfonate, 4-methoxyphenylphenyl iodonium trifluoroacetate, 4-methoxyphenylphenyl iodonium-p-toluene sulfonate, 4-methoxyphenylphenyl iodonium butyltris(2,6-difluorophenyl)borate, 4-methoxyphenylphenyl iodonium hexyltris(p-chlorophenyl)borate, 4-methoxyphenylphenyl iodonium hexyltris(3-trifluoromethylphenyl)borate, bis(4-tert-butylphenyl)iodonium tetrafluoroborate, bis(4-tert-butylphenyl)iodonium hexafluoroarsenate, bis(4-tert-butylphenyl)iodonium trifluoromethane sulfonate, bis(4-tert-butylphenyl)iodonium trifluoroacetate, bis(4-tert-butylphenyl)iodonium-p-toluene sulfonate, bis(4-tert-butylphenyl)iodonium butyltris(2,6-difluorophenyl)borate, bis(4-tert-butylphenyl)iodonium hexyltris(p-chlorophenyl) borate, bis(4-tert-butylphenyl)iodonium hexyltris(3-trifluoromethylphenyl)borate, and the like.

The triaryl sulfonium salts include, for example, triphenyl sulfonium tetrafluoroborate, triphenyl sulfonium hexafluorophosphonate, triphenyl sulfonium hexafluoroarsenate, triphenyl sulfonium trifluoromethane sulfonate, triphenyl sulfonium trifluoroacetate, triphenyl sulfonium-p-toluene sulfonate, triphenyl sulfonium butyltris (2,6-difluorophenyl)borate, triphenyl sulfonium hexyltris(p-chlorophenyl)borate, triphenyl sulfonium hexyltris(3-trifluoromethylphenyl)borate, 4-methoxyphenyl diphenyl sulfonium tetrafluoroborate, 4-methoxyphenyl diphenyl sulfonium hexafluorophosphonate, 4-methoxyphenyl diphenyl sulfonium hexafluoroarsenate, 4-methoxyphenyl diphenyl sulfonium trifluoromethane sulfonate, 4-methoxyphenyl diphenyl sulfonium trifluoroacetate, 4-methoxyphenyl diphenyl sulfonium-p-toluene sulfonate, 4-methoxyphenyl diphenyl sulfonium butyltris(2,6-difluorophenyl)borate, 4-methoxyphenyl diphenyl sulfonium hexyltris(p-chlorophenyl)borate, 4-methoxyphenyl diphenyl sulfonium hexyltris(3-trifluoromethylphenyl)borate, 4-phenylthiophenyl diphenyl sulfonium tetrafluoroborate, 4-phenylthiophenyl diphenyl sulfonium hexafluorophosphonate, 4-phenylthiophenyl diphenyl sulfonium hexafluoroarsenate, 4-phenylthiophenyl diphenyl sulfonium trifluoromethane sulfonate, 4-phenylthiophenyl diphenyl sulfonium trifluoroacetate, 4-phenylthiophenyl diphenyl sulfonium-p-toluene sulfonate, 4-phenylthiophenyl diphenyl sulfonium butyltris(2,6-difluorophenyl)borate, 4-phenylthiophenyl diphenyl sulfonium hexyltris(p-chlorophenyl)borate, 4-phenylthiophenyl diphenyl sulfonium hexyltris(3-trifluoromethylphenyl) borate, 4-hydroxy-1-naphthalenyl)dimethyl sulfonium tetrafluoroborate, 4-hydroxy-1-naphthalenyl)dimethyl sulfonium hexafluorophosphonate, 4-hydroxy-1-naphthalenyl) dimethyl sulfonium hexafluoroarsenate, 4-hydroxy-1-naphthalenyl)dimethyl sulfonium trifluoromethane sulfonate, 4-hydroxy-1-naphthalenyl)dimethyl sulfonium trifluoroacetate, 4-hydroxy-1-naphthalenyl)dimethyl sulfonium-p-toluenesulfonate, 4-hydroxy-1-naphthalenyl) dimethyl sulfonium butyltris(2,6-difluorophenyl)borate, 4-hydroxy-1-naphthalenyl)dimethyl sulfonium hexyltris(p-chlorophenyl)borate, and 4-hydroxy-1-naphthalenyl) dimethyl sulfonium hexyltris(3-trifluoromethylphenyl) borate and the like.

The above quaternary ammonium salts include, for example, tetramethylammonium tetrafluoroborate, tetramethylammonium hexafluorophosphonate, tetramethylammonium hexafluorophosphonate, tetramethylammonium hexafluoroarsenate, tetramethylammonium trifluoromethane sulfonate, tetramethylammonium trifluoroacetate, tetramethylammonium-p-toluene sulfonate, tetramethylammonium butyltris(2,6-difluorophenyl)borate, tetramethylammonium hexyltris(p-chlorophenyl)borate, tetramethylammonium hexyltris(3-trifluoromethylphenyl)borate, tetrabutylammonium tetrafluoroborate, tetrabutylammonium hexafluorophosphonate, tetrabutylammonium hexafluoroarsenate, tetrabutylammonium trifluoromethane sulfonate, tetrabutylammonium trifluoroacetate, tetrabutylammonium-p-toluene sulfonate, tetrabutylammonium butyltris(2,6-difluorophenyl)borate, tetrabutylammonium hexyltris(p-chlorophenyl)borate, tetrabutylammonium hexyltris(3-trifluoromethylphenyl)borate, benzyltrimethylammonium tetrafluoroborate, benzyltrimethylammonium hexafluorophosphonate, benzyltrimethylammonium hexafluoroarsenate, benzyltrimethylammonium trifluoromethane sulfonate, benzyltrimethylammonium trifluoroarsenate, benzyltrimethylammonium-p-toluene sulfonate, benzyltrimethylammonium butyltris(2,6-difluorophenyl)borate, benzyltrimethylammonium hexyltris (p-chlorophenyl)borate, benzyltrimethylammonium hexyltris(3-trifluoromethylphenyl)borate, benzyldimethylphenylammonium tetrafluoroborate, benzyldimethylphenylammonium hexafluorophosphonate, benzyldimethylphenylammonium hexafluoroarsenate, benzyldimethylphenylammonium trifluoromethane sulfonate, benzyldimethylphenylammonium trifluoroacetate, benzyldimethylphenylammonium-p-toluene sulfonate, benzyldimethylphenylammonium butyltris(2,6-difluorophenyl)borate, benzyldimethylphenylammonium hexyltris(p-chlorophenyl)borate, benzyldimethylphenylammonium hexyltris(3-trifluoromethylphenyl) borate, N-cinnamylidene ethylphenylammonium tetrafluoroborate, N-cinnamylidene ethylphenylammonium hexafluorophosphonate, N-cinnamylidene ethylphenylammonium hexafluoroarsenate, N-cinnamylidene ethylphenylammonium trifluoromethane sulfonate, N-cinnamylidene ethylphenylammonium trifluoroacetate, N-cinnamylidene ethylphenylammonium-p-toluene sulfonate, N-cinnamylidene ethylphenylammonium butyltris(2,6-difluorophenyl)borate, N-cinnamylidene ethylphenylammonium hexyltris(p-chlorophenyl)borate, N-cinnamylidene ethylphenylammonium hexyltris(3-trifluoromethylphenyl) borate and the like.

The above sulfonic acid esters include, for example, α-hydroxymethylbenzoin-p-toluene sulfonate, α-hydroxymethylbenzoin-trifluoromethane sulfonate, α-hydroxymethylbenzoin-methane sulfonate, pyrogallol-tri (p-toluenesulfonic acid)ester, pyrogallol-tri (trifluoromethanesulfonic acid)ester, pyrogallol-trimethane sulfonate, 2,4-dinitrobenzyl-p-toluene sulfonate, 2,4-dinitrobenzyl-trifluoromethane sulfonate, 2,4-dinitrobenzyl-methane sulfonate, 2,4-dinitrobenzyl-1,2-naphthoquinonediazido-5-sulfonate, 2,6-dinitrobenzyl-p-toluene sulfonate, 2,6-dinitrobenzyl-trifluoromethane sulfonate, 2,6-dinitrobenzyl-methane sulfonate, 2,6-dinitrobenzyl-1,2-naphthoquinonediazido-5-sulfonate, 2-nitrobenzyl-p-toluene sulfonate, 2-nitrobenzyl-trifluoromethane sulfonate, 2-nitrobenzyl-methane sulfonate, 2-nitrobenzyl-1,2-naphthoquinonediazido-5-sulfonate, 4-nitrobenzyl-p-toluene sulfonate, 4-nitrobenzyl-trifluoromethane sulfonate, 4-nitrobenzyl-methane sulfonate, 4-nitrobenzyl-1,2-naphthoquinonediazido-5-sulfonate, N-hydroxynaphthalimide-p-toluene sulfonate, N-hydroxynaphthalimide-trifluoromethane sulfonate, N-hydroxynaphthalimide-methane sulfonate, N-hydroxy-5-norbornene-2,3-dicarboxyimide-p-toluene sulfonate, N-hydroxy-5-norbornene-2,3-dicarboxyimide-trifluoromethane sulfonate, N-hydroxy-5-norbornene-2,3-dicarboxyimide-methane sulfonate, 2,4,6,3',4',5'-hexahydroxybenzophenne-1,2-naphthoquinonediazido-4-sulfonate, 1,1,1-tri(p-hydroxyphenyl)ethane-1,2-naphthoquinonediazido-4-sulfonate and the like.

Of these compounds, preferred trichloromethyl-s-triazines are 2-(3-chlorophenyl)-bis(4,6-trichloromethyl)-s-triazine, 2-(4-methoxyphenyl)-bis(4,6-trichloromethyl)-s-triazine, 2-(4-methylthiophenyl)-bis(4,6-trichloromethyl)-s-triazine, 2-(4-methoxy-β-styryl)-bis(4,6-trichloromethyl)-s-triazine, 2-piperonyl-bis(4,6-trichloromethyl)-s-triazine, 2-[2-(furan-2-yl)ethenyl]-bis(4,6-trichloromethyl)-s-triazine, 2-[2-(5-methylfuran-2-yl)ethenyl]-bis(4,6-trichloromethyl)-s-triazine, 2-[2-(4-diethylamino-2-methylphenyl)ethenyl)-bis(4,6-trichloromethyl)-s-triazine and 2-(4-methoxynaphthyl)-bis(4,6-trichloromethyl)-s-triazine;

preferred diaryl iodonium salts are diphenyl iodonium trifluoroacetate, diphenyl iodonium trifluoromethane sulfonate, 4-methoxyphenylphenyl iodonium trifluoromethane sulfonate and 4-methoxyphenylphenyl iodonium trifluoroacetate;

preferred triaryl sulfonium salts are triphenyl sulfonium trifluoromethane sulfonate, triphenyl sulfonium trifluoroacetate, 4-methoxyphenyl diphenyl sulfonium trifluoromethane sulfonate, 4-methoxyphenyl diphenyl sulfonium trifluoroacetate, 4-phenylthiophenyl diphenyl sulfonium trifluoromethane sulfonate and 4-phenylthiophenyl diphenyl sulfonium trifluoroacetate;

preferred quaternary ammonium salts are tetramethylammonium butyltris(2,6-difluorophenyl)borate, tetramethylammonium hexyltris(p-chlorophenyl)borate, tetramethylammonium hexyltris(3-trifluoromethylphenyl)borate, benzyldimethylphenylammonium butyltris(2,6-difluorophenyl)borate, benzyldimethylphenylammonium hexyltris(p-chlorophenyl)borate, and benzyldimethylphenylammonium hexyltris(3-trifluoromethylphenyl)borate; and preferred sulfonic acid esters are 2,6-dinitrobenzyl-p-toluene sulfonate, 2,6-dinitrobenzyl-trifuoromethane sulfonate, N-hydroxynaphthalimide-p-toluene sulfonate and N-hydroxynaphthalimide-trifluoromethane sulfonate.

The proportion of the component (B) is preferably 0.001 to 30 parts by weight, more preferably 0.01 to 10 parts by weight, based on 100 parts by weight of the component (A).

When the proportion of the component (B) is less than 0.001 part by weight, based on 100 parts by weight of the component (A), the amount of an acid generated upon exposure to radiation is small and hence, the cross-linking of the molecules of the component (A) does not proceed fully, whereby the ratio of residual film thickness after development and the heat resistance, chemical resistance and adhesion to a substrate of the obtained pattern may lower. On the other hand, when the proportion of the component (B) is more than 30 parts by weight, based on 100 parts by weight of the component (A), the sensitivity of the obtained composition is apt to lower.

Component (C)

The cross-linkable compound as the component (C) is a compound having at least one group (to be referred to as "cross-linkable group" hereinafter) which can be cross-linked by the action of an acid generated by the component (B).

The cross-linkable group is preferably an amino group, an alkoxyalkyl group, an epoxy group, an oxazolinyl group, an oxazinyl group, an oxetanyl group, an isocyanate group and a cyanate group. The alkoxyalkyl group is preferably an alkoxymethyl group.

Illustrative examples of the cross-likable compound as the component (C) include epoxy, oxetanes, alkoxymethylated melamine, alkoxymethylated glycoluril, alkoxymethylated benzoguanamine, alkoxymethylated urea, isocyanates, cyanates, oxazolines, oxazines and the like.

Commercial products of the bisphenol A epoxy resins include Epicoat 1001, 1002, 1003, 1004, 1007, 1009, 1010 and 828 (of Yuka Shell Epoxy Co., Ltd.); those of the bisphenol F epoxy resins include Epicoat 807 (Yuka Shell Epoxy Co., Ltd.); those of the phenol novolak epoxy resins include Epicoat 152 and 154 (of Yuka Shell Epoxy Co., Ltd.) and EPPN 201 and 202 (of Nippon Kayaku Co., Ltd.); those of the cresol novolak epoxy resins include EOCN-102, EOCN-103S, EOCN-104S, EOCN-1020, EOCN-1025 and EOCN-1027 (of Nippon Kayaku Co., Ltd.) and Epicoat 180S75 (of Yuka Shell Epoxy Co., Ltd.); those of the cyclic aliphatic epoxy resins include CY175, CY177 and CY179 (of CIBA-GEIGY A.G.), ERL-4234, ERL-4299, ERL-4221 and ERL-4206 (of U.C.C.), Showdyne 509 (Showa Denko K.K.), Araldite CY-182, CY-192 and CY-184 (of CIBA-GEIGY A.G.), Epiclon 200 and 400 (of Dainippon Ink & Chemicals, Inc.), Epicoat 871 and 872 (of Yuka Shell Epoxy Co., Ltd.) and ED-5661 and ED-5662 (of Celanese Coating Co., Ltd.); and those of the aliphatic polyglycidyl ethers include Epolite 100MF (of Kyoei Yushi Kagaku Co., Ltd.) and Epiole TMP (of NOF Corporation).

Of these, bisphenol A epoxy resins, phenol novolak epoxy resins and cresol novolak epoxy resins are preferred.

Most of the above listed compounds are high molecular weight polymers, but the molecular weights of the compounds are not particularly limited. Low molecular weight polymers such as bisphenol A and bisphenol F glycidyl ethers may also be used.

The proportion of the compound containing two or more epoxy groups in the molecule is generally 100 parts or less by weight, preferably 50 parts or less by weight, based on 100 parts by weight of the component (A).

The above oxetanes include, for example, [(3-ethyl-3-oxetanylmethoxy)methyl]benzene (trade name: XDO of Toa Gosei Chemical Industry Co., Ltd.), bis[(3-ethyl-3-oxetanylmethoxy)methyl-phenyl]methane, bis[(3-ethyl-3-oxetanylmethoxy)methyl-phenyl]ether, bis[(3-ethyl-3-oxetanylmethoxy)methyl-phenyl]propane, bis[(3-ethyl-3-oxetanylmethoxy)methyl-phenyl]sulfone, bis[(3-ethyl-3-oxetanylmethoxy)methyl-phenyl]ketone, bis[(3-ethyl-3-oxetanylmethoxy)methyl-phenyl]hexafluoropropane, tri[(3-ethyl-3-oxetanylmethoxy)methyl]benzene, tetra[(3-ethyl-3-oxetanylmethoxy)methyl]benzene and the like.

The above alkoxymethylated melamine, alkoxymethylated benzoguanamine, alkoxymethylated glycoluril and alkoxymethylated urea are obtained by replacing the methylol group of methylol melamine, methylol benzoguanamine, methylol glycoluril and methylol urea by an alkoxymethyl group. This alkoxymethyl group is not limited to a particular kind and selected from the group consisting of a methoxymethyl group, ethoxymethyl group, propoxymethyl group, butoxymethyl group and the like.

Of these cross-linkable compounds, alkoxymethylated melamine and alkoxymethylated benzoguanamine are preferred.

Cross-linkable compounds marketed under the trade names of Cymel 300, 301, 303, 370, 325, 327, 701, 266, 267, 238, 1141, 272, 202, 1156, 1158, 1123, 1170 and 1174, and UFR 65 and 300 (of Mitsui Cyanamid Co., Ltd.) and Nikalak Mx-750, Mx-032, Mx-706, Mx-708, Mx-40, Mx-31, Ms-11 and Mw-30 (of Sanwa Chemical Co., Ltd.) can be preferably used as the cross-linkable compound.

These cross-linkable compounds may be used alone or in combination of two or more.

The above isocyanates include, for example, phenylene-1,3-diisocyanate, phenylene-1,4-diisocyanate, 1-methoxyphenylene-2,4-diisocyanate, 1-methylphenylene-2,4-diisocyanate, 2,4-tolylenediisocyanate, 2,6-tolylenediisocyanate, 1,3-xylylenediisocyanate, 1,4-xylylenediisocyanate, biphenylene-4,4'-diisocyanate, 3,3'-dimethoxybiphenylene-4,4'-diisocyanate, 3,3'-dimethylbiphenylene-4,4'-diisocyanate, diphenylmethane-2,4'-diisocyanate, diphenylmethane-4,4'-diisocyanate, 3,3'-dimethoxydiphenylmethane-4,4'-diisocyanate, 3,3'-dimethyldiphenylmethane-4,4'-diisocyanate, naphthylene-1,5-diisocyanate, cyclobutylene-1,3-diisocyanate, cyclopentylene-1,3-diisocyanate, cyclohexylene-1,3-diisocyanate, cyclohexylene-1,4-diisocyanate, 1-methylcyclohexylene-2,4-diisocyanate, 1-methylcyclohexylene-2,6-diisocyanate, 1-isocyanate-3,3,5-trimethyl-5-isocyanate methylcyclohexane, cyclohexane-1,3-bis(methylisocyanate), cyclohexane-1,4-bis(methylisocyanate), isophoronediisocyanate, dicyclohexylmethane-2,4'-diisocyanate, dicyclohexylmethane-4,4'-diisocyanate, ethylenediisocyanate, tetramethylene-1,4-diisocyanate, hexamethylene-1,6-diisocyanate, dodecamethylene-1,12-diisocyanate, lysinedilsocyanate methyl ester, prepolymers having isocyanate groups at both terminals obtained by reacting a stoichiometrically excessive amount of these organic diisocyanates and a bifunctional active hydrogen-containing compounds, and the like.

These organic diisocyanates may be used alone or in combination of two or more.

Other organic polyisocyanates usable in combination with these organic diisocyanates as the case may be include, for example, organic polyisocyanates having at least 3 functional groups such as phenyl-1,3,5-triisocyanate, diphenylmethane-2,4,4'-triisocyanate, diphenylmethane-2,5,4'-triisocyanate, triphenylmethane-2,4',4"-triisocyanate, triphenylmethane-4,4',4"-triisocyanate, diphenylmethane-2,4,2',4'-tetraisocyanate, diphenylmethane-2,5,2',5'-tetraisocyanate, cyclohexane-1,3,5-triisocyanate, cyclohexane-1,3,5-tris(methylisocyanate), 3,5-dimethylcyclohexane-1,3,5-tris(methylisocyanate), 3,5-dimethylcyclohexane-1,3,5-tris(methylisocyanate), 1,3,5-trimethylcyclohexane-1,3,5-tris(methylisocyanate), dicyclohexylmethane-2,4,2'-triisocyanate and dicyclohexylmethane-2,4,4'-triisocyanate; prepolymers having an isocyanate group at the terminal obtained by reacting a stoichiometrically excessive amount of these organic polyisocyanates having at least 3 functional groups and polyfunctional active hydrogen-containing compounds having at least 2 functional groups; and the like.

The above cyanates include, for example, 1,3-dicyanate benzene, 1,4-dicyanate benzene, 1,3,5-tricyanate benzene, 1,3-, 1,4-, 1,6-, 1,8-, 2,6- or 2,7-dicyanate naphthalene, 1,3,6-tricyanate naphthalene, 2,2'- or 4,4'-dicyanate biphenyl, bis(4-cyanatephenyl)methane, 2,2-bis(4-cyanatephenyl)propane, 2,2'-bis(3,5-dichloro-4-cyanatephenyl)propane, 2,2-bis(4-cyanatephenyl)ethane, bis(4-cyanatephenyl)ether, bis(4-cyanatephenyl)thioether, bis(4-cyanatephenyl)sulfone, 1,1,1,3,3,3-hexafluoro-2,2-bis(4-cyanatephenyl)propane, tris(4-cyanatephenyl)phosphite, tris(4-cyanatephenyl)phosphate, polyisocyanate compounds of benzene polynuclear materials obtained by reacting phenol resins and cyan halide (see JP-B 45-11712 and 55-9433, for example) (the term "JP-B" as used herein means an "examined Japanese patent publication"), and the like. Divalent cyanate compounds derived from bisphenol, such as 2,2-bis(4-cyanatephenyl)propane, are particularly preferred because they can be easily obtained and provide moldability and favorable properties to final cured products. Polycyanates obtained by reacting an initial condensate of phenol and formaldehyde with cyan halide are also useful.

The above oxazolines include, for example, 2,2'-bis(2-oxazoline), 4-furan-2-ylmethylene-2-phenyl-4H-oxazol-5-one, 1,4-bis(4,5-dihydro-2-oxazolyl)benzene, 1,3-bis(4,5-dihydro-2-oxazolyl)benzene, 2,3-bis(4-isopropenyl-2-oxazolin-2-yl)butane, 2,2'-bis-4-benzyl-2-oxazoline, 2,6-bis(isopropyl-2-oxazolin-2-yl)pyridine, 2,2'-isopropylidenebis(4-tert-butyl-2-oxazoline), 2,2'-isopropylidenebis(4-phenyl-2-oxazoline), 2,2'-methylenebis(4-tert-butyl-2-oxazoline), 2,2'-methylenebis(4-phenyl-2-oxazoline), and the like.

The above oxazines include, for example, 2,2'-bis(2-oxazine), 4-furan-2-ylmethylene-2-phenyl-4H-oxazyl-5-one, 1,4-bis(4,5-dihydro-2-oxazyl)benzene, 1,3-bis(4,5-dihydro-2-oxazyl)benzene, 2,3-bis(4-isopropenyl)-2-oxazin-2-yl)butane, 2,2'-bis(4-benzyl-2-oxazine, 2,6-bis(isopropyl-2-oxazin-2-yl)pyridine, 2,2'-isopropylidenebis(4-tert-butyl- 2-oxazine), 2,2'-isopropylidenebis(4-phenyl-2-oxazine), 2,2'-methylenebis(4-tert-butyl-2-oxazine), 2,2'-methylenebis(4-phenyl-2-oxazine) and the like.

The proportion of the cross-linkable compound as the component (C) is preferably 1 to 100 parts by weight, particularly preferably 5 to 50 parts by weight, based on 100 parts by weight of the component (A).

When the proportion of the component (C) is less than 1 part by weight, based on 100 parts by weight of the component (A), the cross-linking of the system becomes insufficient, whereby it may be difficult to form a pattern. On the other hand, when the proportion of the component (C) is more than 100 parts by weight, based on 100 parts by weight of the component (A), the alkali solubility of the composition becomes excessive as a whole and the ratio of residual film thickness after development tends to lower.

Component (D)

Illustrative examples of the solvent for the preparation of the above composition solution are the same as those listed for the polymerization solvent used for the production of the above fluorine-containing copolymer. The solvent may further contain a high-boiling solvent such as benzyl ethyl ether, dihexyl ether, diethylene glycol monomethyl ether, diethylene glycol monoethyl ether, diethylene glycol monobutyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, carbitol acetate or the like, as required.

The organic solvent is preferably contained in an amount of 30 to 10,000 parts by weight, based on 100 parts by weight of the total of the components (A), (B) and (C).

Other Components

The radiation sensitive resin composition of the present invention may contain a sensitizing agent. Illustrative examples of the sensitizing agent include coumarins which have a substituent at the 3-position and/or 7-position, flavones, dibenzalacetones, dibenzalcyclohexanes, chalcones, xanthenes, thioxanthenes, porphyrins, phthalocyanines, acridines, anthracenes, benzophenones, acetophenones and the like.

The proportion of the sensitizing agent used is 30 parts or less by weight, preferably 0.1 to 20 parts by weight, based on 100 parts by weight of the component (A).

To the radiation sensitive resin composition of the present invention may be added a surfactant to improve coating properties (for example, the prevention of striation) and developability.

Illustrative examples of the surfactant include polyoxyethylene alkyl ethers such as polyoxyethylene lauryl ether, polyoxyethylene stearyl ether and polyoxyethylene oleyl ether; polyoxyethylene aryl ethers such as polyoxyethylene octylphenyl ether and polyoxyethylene nonylphenyl ether; nonionic surfactants such as polyethylene glycol dialkyl esters exemplified by polyethylene glycol dilaurate and polyethylene glycol distearate; fluorine-based surfactants marketed under the trade names of F Top EF301, EF303 and EF352 (of Shin Akita Kasei Co., Ltd.), Megafax F171, F172 and F173 (of Dainippon Ink & Chemicals, Inc.), Florad FC430 and FC431 (of Sumitomo 3M Limited.), and Asahi Guard AG710, Surflon S-382 SC-101, SC-102, SC-103, SC-104, SC-105 and SC-106 (of Asahi Glass Co., Ltd.); and other surfactants marketed under the trade names of Organosiloxane Polymer KP341 (of Shin-Etsu Chemical Co., Ltd.), and acrylic acid- or methacrylic acid-based (co) polymer Polyflow No. 57 and 95 (Kyoei Yushi Kagaku Kogyo Co., Ltd.).

The proportion of the surfactant used is generally 2 parts or less by weight, preferably 1 part or less by weight, based on 100 parts by weight of the solid content of the composition.

To the radiation sensitive resin composition of the present invention may be further added an adhesive aid such as a silane coupling agent to improve adhesion to a substrate and an unsaturated compound such as a polyacrylate to improve heat resistance.

To the radiation sensitive resin composition of the present invention may be still further added an antistatic agent, storage stabilizer, halation preventing agent, antifoaming agent, pigment, thermally acid generating agent and the like as required.

Formation of pattern

Using the radiation sensitive resin composition of the present invention, a pattern can be formed as follows, for example.

The radiation sensitive resin composition is first dissolved in a solvent so as to have a solid content of 5 to 60 wt % and the resulting mixture is filtered with a filter having a pore diameter of 0.2 to 10 μm to prepare a composition solution.

This composition solution is then coated on the surface of a substrate such as a silicon wafer and pre-baked to remove the solvent to form a coating film of the radiation sensitive resin composition. Thereafter, the formed coating film is exposed to radiation and then subjected to a PEB treatment. Subsequently, development is carried out to remove unexposed portions. Thus, a pattern is formed.

To coat the composition solution on the substrate, a rotation coating, cast coating, roll coating or the like can be employed.

The pre-baking conditions are, for example, a heating temperature of 50 to 150° C. and a heating time of 30 to 600 seconds.

Illustrative examples of the radiation used for exposure include ultraviolet light such as an i-line having a wavelength of 365 nm and g-line having a wavelength of 436 nm, far ultraviolet light such as KrF excimer laser beam having a wavelength of 248 nm and ArF excimer laser beam having a wavelength of 193 nm, and charged particle beams such as an X ray exemplified by synchrotron radiation and electron beam.

A developing solution used for development is an alkali aqueous solution of sodium hydroxide, sodium carbonate, sodium silicate, sodium metasilicate, aqueous ammonia, ethylamine, n-propylamine, diethylamine, di-n-propylamine, triethylamine, methyl diethylamine, dimethyl ethanolamine, triethanolamine, tetramethylammonium hydroxide, tetraethylammonium hydroxide, choline, pyrrole, piperidine, 1,8-diazabicyclo(5.4.0)-7-undecene, 1,5-diazabicyclo(4.3.0)-5-nonane or the like. This alkali solution may contain a water-soluble organic solvent such as alcohol exemplified by methanol or ethanol and a surfactant in suitable amounts.

Development can be carried out by a puddle development, dip development, oscillation immersion or the like for 10 to 300 seconds, for example.

The coating film is rinsed with running water after development and blown to dry with compressed air or compressed nitrogen gas, and the surface of the thin film is exposed, for example, to ultraviolet radiation as required and post-baked by a heater such as a hot plate or an oven. The normal post-baking conditions are a temperature of 150 to 250° C. and a time of 3 minutes to 2 hours. The cured patterned thin film is thus formed on the substrate.

The dielectric constant of the thus obtained patterned thin film is 3 or less, preferably 2.8 or less. The patterned thin film has high resolution and a low dielectric constant, and is excellent in physical properties such as insulation properties, flatness, heat resistance, transparency and hardness. Therefore, it is useful as a protective film, flat film or interlaminar insulating film for electronic parts, particularly an interlaminar insulating film for liquid crystal display elements, integrated circuit elements and solid image pick-up elements.

The following examples are provided to further illustrate the present invention but in no way limit the scope of the present invention.

The average molecular weight in terms of polystyrene of a polymer was measured by the GPC Chromatograph SYSTEM-21 of Showa Denko K.K. using tetrahydrofuran (THF) as a carrier solvent at a flow rate of 1 ml/min and at a temperature of 40° C.

Synthesis Examples of fluorine-containing copolymers

SYNTHESIS EXAMPLE 1

After the inside of a stainless steel autoclave equipped with an electromagnetic stirrer and having an internal volume of 0.5 liter was fully substituted with a nitrogen gas, 270 g of ethyl acetate, 34.2 g of ethyl vinyl ether (EVE), 27.2 g of crotonic acid (CA) and 5.4 g of lauroyl peroxide were charged into the autoclave. The autoclave was cooled to −50° C. with dry ice-methanol, and oxygen in the system was removed with a nitrogen gas again. Thereafter, 119 g of hexafluoropropylene (HFP) was charged into the autoclave to start elevating the temperature of the autoclave. When the temperature of the autoclave reached 70° C., the pressure was 7.6 kgf/cm$^2$. A reaction was then continued under agitation at 70° C. for 12 hours, and when the pressure dropped to 6.3 kgf/cm$^2$, the autoclave was cooled with water to stop the reaction. When the temperature of the autoclave reached room temperature, unreacted monomers were discharged and the autoclave was opened to obtain a polymer solution having a solid content of 19.6 wt %. After the obtained polymer solution was put into water to precipitate a polymer, the polymer was re-precipitated and purified with n-hexane and dried at 50° C. under vacuum to obtain 80 g of a fluorine-containing copolymer (to be referred to as "resin (1)" hereinafter).

When the average molecular weight in terms of polystyrene of the obtained resin (1) was measured by the GPC Chromatograph SYSTEM-21 of Showa Denko K.K., it was found to be 8,400.

SYNTHESIS EXAMPLE 2

After the inside of a stainless steel autoclave equipped with an electromagnetic stirrer and having an internal volume of 0.5 liter was fully substituted with a nitrogen gas, 270 g of ethyl acetate, 28.3 g of ethyl vinyl ether (EVE), 33.8 g of crotonic acid (CA) and 5.4 g of lauroyl peroxide were charged into the autoclave. The autoclave was cooled to −50° C. with dry ice-methanol, and oxygen in the system was removed with a nitrogen gas again. Thereafter, 118 g of hexafluoropropylene (HFP) was charged into the autoclave to start elevating the temperature of the autoclave. When the temperature of the autoclave reached 70° C., the pressure was 7.8 kgf/cm$^2$. A reaction was then continued under agitation at 70° C. for 12 hours, and when the pressure dropped to 6.9 kgf/cm$^2$, the autoclave was cooled with water to stop the reaction. When the temperature of the autoclave reached room temperature, unreacted monomers were discharged and the autoclave was opened to obtain a polymer solution having a solid content of 18.0%. After the obtained polymer solution was put into water to precipitate a polymer, the polymer was re-precipitated and purified with n-hexane and dried at 50° C. under vacuum to obtain 80 g of a fluorine-containing copolymer (to be referred to as "resin (2)" hereinafter). When the average molecular weight in terms of polystyrene of the obtained resin (2) was measured by the GPC Chromatograph SYSTEM-21 of Showa Denko K.K., it was found to be 3,900.

SYNTHESIS EXAMPLE 3

After the inside of a stainless steel autoclave equipped with an electromagnetic stirrer and having an internal volume of 0.5 liter was fully substituted with a nitrogen gas, 270 g of ethyl acetate, 22.5 g of ethyl vinyl ether (EVE), 40.3 g of crotonic acid (CA) and 5.4 g of lauroyl peroxide were charged into the autoclave. The autoclave was cooled to −50° C. with dry ice-methanol, and oxygen in the system was removed with a nitrogen gas again. Thereafter, 117 g of hexafluoropropylene (HFP) was charged into the autoclave to start elevating the temperature of the autoclave. When the temperature of the autoclave reached 70° C., the pressure was 8.3 kgf/cm$^2$. A reaction was then continued under agitation at 70° C. for 12 hours, and when the pressure dropped to 7.0 kgf/cm$^2$, the autoclave was cooled with water to stop the reaction. When the temperature of the autoclave reached room temperature, unreacted monomers were discharged and the autoclave was opened to obtain a polymer solution having a solid content of 16.8%. After the obtained polymer solution was put into water to precipitate a polymer, the polymer was re-precipitated and purified with n-hexane and dried at 50° C. under vacuum to obtain 80 g of a fluorine-containing copolymer (to be referred to as "resin (3)" hereinafter).

When the average molecular weight in terms of polystyrene of the obtained resin (3) was measured by the GPC Chromatograph SYSTEM-21 of Showa Denko K.K., it was found to be 2,800.

SYNTHESIS EXAMPLE 4

After the inside of a stainless steel autoclave equipped with an electromagnetic stirrer and having an internal volume of 0.5 liter was fully substituted with a nitrogen gas, 270 g of ethyl acetate, 16.3 g of ethyl vinyl ether (EVE), 32.5 g of crotonic acid (CA), 17.6 g of hydroxybutyl vinyl ether (HBVE) and 5.4 g of lauroyl peroxide were charged into the autoclave. The autoclave was cooled to −50° C. with dry ice-methanol, and oxygen in the system was removed with a nitrogen gas again. Thereafter, 114 g of hexafluoropropylene (HFP) was charged into the autoclave to start elevating the temperature of the autoclave. When the temperature of the autoclave reached 70° C., the pressure was 8.2 kgf/cm$^2$. A reaction was then continued under agitation at 70° C. for 12 hours, and when the pressure dropped to 7.3 kgf/cm$^2$, the autoclave was cooled with water to stop the reaction. When the temperature of the autoclave reached room temperature, unreacted monomers were discharged and the autoclave was opened to obtain a polymer solution having a solid content of 19.0%. After the obtained polymer solution was put into water to precipitate a polymer, the polymer was re-precipitated and purified with n-hexane and dried at 50° C. under vacuum to obtain 80 g of a fluorine-containing copolymer (to be referred to as "resin (4)" hereinafter).

When the average molecular weight in terms of polystyrene of the obtained resin (4) was measured by the GPC Chromatograph SYSTEM-21 of Showa Denko K.K., it was found to be 4,500.

SYNTHESIS EXAMPLE 5

After the inside of a stainless steel autoclave equipped with an electromagnetic stirrer and having an internal volume of 0.5 liter was fully substituted with a nitrogen gas, 270 g of diethylene glycol ethyl methyl ether (EDM), 22.3 g of ethyl vinyl ether (EVE), 26.6 g of crotonic acid (CA), 15.5 g of glycidyl vinyl ether (GVE) and 5.4 g of lauroyl peroxide were charged into the autoclave. The autoclave was cooled to −50° C. with dry ice-methanol, and oxygen in the system was removed with a nitrogen gas again. Thereafter, 116 g of hexafluoropropylene (HFP) was charged into the autoclave to start elevating the temperature of the autoclave. When the temperature of the autoclave reached 70° C., the pressure was 8.8 kgf/cm$^2$. A reaction was then continued under agitation at 70° C. for 12 hours, and when the pressure dropped to 8.3 kgf/cm$^2$, the autoclave was cooled with water to stop the reaction. When the temperature of the autoclave reached room temperature, unreacted monomers were discharged and the autoclave was opened to obtain a polymer solution having a solid content of 21.1%. After the obtained polymer solution was put into water to precipitate a polymer, the polymer was re-precipitated and purified with n-hexane and dried at 50° C. under vacuum to obtain 80 g of a fluorine-containing copolymer (to be referred to as "resin (5)" hereinafter).

When the average molecular weight in terms of polystyrene of the obtained resin (5) was measured by the GPC Chromatograph SYSTEM-21 of Showa Denko K.K., it was found to be 1,800.

EXAMPLE 1

100 Parts by weight of the resin (1) as the component (A), 5 parts by weight of 2-piperonyl-bis(4,6-trichloromethyl)-s-triazine as the component (B), and 20 parts by weight of "Cymel 300", which was hexamethoxymethylol melamine resin, as the component (C) were dissolved in diethylene glycol ethyl methyl ether so as to obtain a total solid content of 40%. The resulting mixture was filtered with a membrane filter having a pore diameter of 0.2 μm to prepare the composition solution of the present invention.

Formation of coating film

The composition solution 1 was coated on a silicon substrate using a spinner. The silicon substrate was pre-baked on a hot plate at 110° C. for 2 minutes to form a 3.0 μm-thick coating film.

Exposure to radiation and development

The obtained coating film was exposed to radiation at the optimal focusing depth by the NSR1505i6A stepper (manufactured by Nikon Corporation, NA=0.45, λ=365 nm) and subjected to a PEB treatment on a hot plate at 110° C. for 2 minutes. Thereafter, the coating film was developed at 25° C. for 1 minute using a 0.5 wt % aqueous solution of tetramethyl ammonium hydroxide, washed with water and dried to form a pattern.

Post-Baking

The silicon substrate having this pattern formed thereon was heated on the hot plate at 200° C. for 1 hour to post-bake the pattern. Thus, a silicon substrate having a patterned thin film formed thereon was obtained.

Measurement of Dielectric Constant

The dielectric constant was measured at room temperature at 1 MHz. The results are shown in Table 1.

Evaluation of Sensitivity to Radiation

The PEB treatment and development were carried out by changing the exposure time of ultraviolet light. The sensitivity to radiation was evaluated as ○ when patterning was possible with the resolution of 5.0 μm×5.0 μm or less and the sensitivity of 30 $mJ/cm^2$ or less and, Δ when patterning was possible with the sensitivity of 50 $mJ/cm^2$ or less, and X when either the resolution was larger than 5.0 μm×5.0 μm or the sensitivity was higher than 50 $mJ/cm^2$ or when these did not reach the above level simultaneously. The results are shown in Table 1.

Evaluation of Heat Resistant Dimensional Stability

After the silicon substrate having a patterned thin film formed thereon was heated in an oven at 200° C. for 1 hour, a change in the thickness of the patterned thin film was measured. The heat resistant dimensional stability was evaluated as ○ when the thickness of the thin film after heating was more than 95% of the thickness before heating, Δ when the thickness was 90 to 95%, and X when the thickness was less than 90%. The results are shown in Table 1.

Evaluation of Transparency

A glass substrate having a patterned thin film formed thereon was obtained in the same manner as described above except that the Corning 7059 glass substrate (manufactured by Corning Co., Ltd.) was used in place of the silicon substrate.

The transmittance of the obtained glass substrate was measured at a wavelength of 400 to 800 nm, using the 150-20 Double Beam spectrometer of Hitachi, Ltd. The transparency was evaluated as ○ when the minimum transmittance was more than 95%, Δ when the minimum transmittance was 90 to 95% and X when the minimum transmittance was less than 90%. The results are shown in Table 1.

Evaluation of Solvent Resistance

The glass substrate having a patterned thin film formed thereon was immersed in dimethyl sulfoxide heated at 70° C. for 15 minutes and measured for a change in the thickness of the patterned thin film. The solvent resistance was evaluated as ○ when the change was 10% or less, Δ when the change was more than 10%, and X when the thin film swelled greatly and peeled off from the substrate. The results are shown in Table 1.

EXAMPLES 2 TO 5

Evaluations were carried out in the same manner as in Example 1 except that the resins 2 to 5 shown in Table 1 were used. The results are shown in Table 1.

EXAMPLE 6

Evaluation was carried out in the same manner as in Example 1 except that 4-phenylthiophenyl hexafluorophosphonate was used as the (B) component. The result is shown in Table 1.

EXAMPLE 7

Evaluation was carried out in the same manner as in Example 1 except that diphenyl iodonium trifluoroacetate was used as the (B) component. The result is shown in Table 1.

EXAMPLES 8 TO 14

Evaluations were carried out in the same manner as in Example 1 except that (2) to (8) of the components (C) shown in Table 1 were used. The results are shown in Table 1.

TABLE 1

| | Resin | Component (C) | Dielectric constant | Sensitivity to Radiation | Heat resistant dimensional stability | Transparency | Solvent resistance |
|---|---|---|---|---|---|---|---|
| Ex. 1 | 1 | 1 | 2.61 | Δ | ○ | ○ | ○ |
| Ex. 2 | 2 | 1 | 2.65 | ○ | ○ | ○ | ○ |
| Ex. 3 | 3 | 1 | 2.73 | ○ | ○ | Δ | ○ |
| Ex. 4 | 4 | 1 | 2.75 | ○ | ○ | ○ | ○ |
| Ex. 5 | 5 | 1 | 2.85 | ○ | ○ | ○ | ○ |
| Ex. 6 | 1 | 1 | 2.62 | ○ | ○ | Δ | ○ |
| Ex. 7 | 1 | 1 | 2.61 | ○ | ○ | Δ | ○ |
| Ex. 8 | 1 | 2 | 2.77 | ○ | ○ | ○ | ○ |
| Ex. 9 | 1 | 3 | 2.73 | ○ | ○ | ○ | ○ |
| Ex. 10 | 1 | 4 | 2.71 | ○ | ○ | Δ | ○ |
| Ex. 11 | 1 | 5 | 2.60 | ○ | ○ | ○ | ○ |
| Ex. 12 | 1 | 6 | 2.70 | ○ | ○ | Δ | ○ |
| Ex. 13 | 1 | 7 | 2.63 | Δ | ○ | Δ | ○ |
| Ex. 14 | 1 | 8 | 2.65 | ○ | ○ | ○ | ○ |

TABLE 1-continued

| Resin | Component (C) | Dielectric constant | Sensitivity to Radiation | Heat resistant dimensional stability | Transparency | Solvent resistance |
|---|---|---|---|---|---|---|

Ex.: Example

In the above Table 1, the numerals of the components (C) shown in Table 1 denote the following: (1) is hexamethoxymethylol melamine (trade name: CYMEL300 of Mitsui Cyanamid Co., Ltd.), (2), Epicoat 807 (Yuka Shell Epoxy Co., Ltd.), (3), [(3-ethyl-3-oxetanylmethoxy)methyl] benzene (trade name: XDO of Toagosei Chemical Industry Co., Ltd.), (4), phenylene-1,3-diisocyanate, (5), 1,3,5-tricyanate benzene, (6), 1,3-bis(4,5-dihydro-2-oxazolyl) benzene, (7), 1,3-bis(4,5-dihydro-2-oxazyl)benzene, (8), tetramethoxymethyl glycoluril (trade name: CYMEL1170 of Mitsui Cyanamid Co., Ltd.)

The radiation sensitive resin composition of the present invention can be developed with an alkaline aqueous solution, has high resolution and high sensitivity and makes it possible to form with ease a patterned thin film having excellent characteristic properties such as heat resistance, solvent resistance and transparency as well as excellent low dielectric properties which have been difficult to obtain together with the above characteristic properties in the prior art.

What is claimed is:

1. A radiation sensitive resin composition comprising:

(A) a fluorine-containing copolymer of (a-1) hexafluoropropylene, (a-2) at least one compound selected from the group consisting of unsaturated carboxylic acids and unsaturated carboxylic anhydrides, and (a-3) an unsaturated compound copolymerizable with the components (a-1) and (a-2);

(B) an acid generating compound which generates an acid upon exposure to radiation;

(C) a cross-linkable compound; and (D) an organic solvent in which the components (A), (B) and (C) are dissolved.

2. The radiation sensitive resin composition of claim 1, wherein at least one compound (a-2) selected from the group consisting of unsaturated carboxylic acids and unsaturated carboxylic anhydrides is at least one compound selected from the group consisting of unsaturated monocarboxylic acids, unsaturated dicarboxylic acids, (meth)acrylates of hydroxy-fatty acids, (meth)acrylates of aromatic hydroxy-carboxylic acids, mono(meth)acryloyloxyethyl esters of dicarboxylic acids, monoalkyl esters of unsaturated poly-carboxylic acids and unsaturated carboxylic anhydrides.

3. The radiation sensitive resin composition of claim 1, wherein the copolymerizable unsaturated compound (a-3) is at least one compound selected from the group consisting of hydroxyl group-containing vinyl ethers, hydroxyl group-containing allyl ethers, allyl alcohols, alkyl vinyl ethers, cycloalkyl vinyl ethers, perfluoro(alkyl vinyl ethers), perfluoro(alkoxyalkyl vinyl ethers), (fluoroalkyl)vinyl ethers, (fluoroalkoxyalkyl)vinyl ethers, fluoroolefins, vinyl carboxylates, $\alpha$-olefins, fluorine-containing (meth)acrylates, (meth)acrylates, epoxy group-containing (meth)acrylates, epoxy group-containing unsaturated aliphatic compounds and glycidyl ethers.

4. The radiation sensitive resin composition of claim 1, wherein the fluorine-containing copolymer (A) comprises 20 to 70 wt % of a polymerized unit derived from the component (a-1), 1 to 40 wt % of a polymerized unit derived from the component (a-2) and 70 wt % of a polymerized unit derived from the component (a-3), based on the total of the components (a-1), (a-2) and (a-3).

5. The radiation sensitive resin composition of claim 1, wherein the fluorine-containing copolymer (A) has a fluorine content of at least 40 wt %.

6. The radiation sensitive resin composition of claim 1, wherein the acid generating compound (B) which generates an acid upon exposure to radiation is selected from the group consisting of trichloromethyl-s-triazines, diaryl iodonium salts, triaryl sulfonium salts, quaternary ammonium salts and sulfonic acid esters.

7. The radiation sensitive resin composition of claim 1, which contains the acid generating compound (B) in an amount of 0.001 to 30 parts by weight, based on 100 parts by weight of the component (A).

8. The radiation sensitive resin composition of claim 1, wherein the cross-linkable compound (C) is at least one resin selected from cross-linkable compounds having at least one cross-linkable group selected from the group consisting of an amino group, an alkoxyalkyl group, an epoxy group, an oxazolinyl group, an oxazinyl group, an oxetanyl group, an isocyanate group and a cyanate group.

9. The radiation sensitive resin composition of claim 1, which contains the cross-linkable compound (C) in an amount of 1 to 100 parts by weight, based on 100 parts by weight of the component (A).

10. The radiation sensitive resin composition of claim 1, which contains the organic solvent (D) in an amount of 30 to 10,000 parts by weight, based on 100 parts by weight of the total of the components (A), (B) and (C).

11. The radiation sensitive resin composition of claim 1, which further contains a sensitizing agent.

12. The radiation sensitive resin composition of claim 11, which contains the sensitizing agent in an amount of 30 parts by weight or less, based on 100 parts by weight of the component (A).

13. The radiation sensitive resin composition of claim 1 which further contains a surfactant.

14. The radiation sensitive resin composition of claim 13, which contains the surfactant in an amount of 2 parts by weight or less, based on 100 parts by weight of the solid content of the composition.

* * * * *